(12) United States Patent
Mayer

(10) Patent No.: US 8,933,495 B2
(45) Date of Patent: Jan. 13, 2015

(54) CHARGE-INTEGRATION MULTILINEAR IMAGE SENSOR

(75) Inventor: Frederic Mayer, Voiron (FR)

(73) Assignee: E2V Semiconductors, Saint-Égrève (FR)

( * ) Notice: Subject to any disclaimer, the term of this patent is extended or adjusted under 35 U.S.C. 154(b) by 259 days.

(21) Appl. No.: 13/359,200

(22) Filed: Jan. 26, 2012

(65) Prior Publication Data

US 2012/0193683 A1 Aug. 2, 2012

(30) Foreign Application Priority Data

Jan. 28, 2011 (FR) ...................................... 11 50658

(51) Int. Cl.
*H01L 27/148* (2006.01)
(52) U.S. Cl.
CPC .............................. *H01L 27/14856* (2013.01)
USPC .................................. 257/225; 257/E27.152
(58) Field of Classification Search
CPC ................................................. H01L 27/14856
USPC .......................................... 257/225, E27.152
See application file for complete search history.

(56) References Cited

U.S. PATENT DOCUMENTS

| 6,465,820 | B1* | 10/2002 | Fox ................................. 257/223 |
| 6,680,222 | B2* | 1/2004 | Hynecek ........................ 438/144 |
| 2005/0046722 | A1 | 3/2005 | Okada |
| 2007/0064137 | A1* | 3/2007 | Kanbe ............................ 348/311 |
| 2008/0217661 | A1 | 9/2008 | Lauxtermann |

OTHER PUBLICATIONS

French Search Report for FR1150658, dated Sep. 1, 2011.

* cited by examiner

*Primary Examiner* — Tom Thomas
*Assistant Examiner* — Benjamin Tzu-Hung Liu
(74) *Attorney, Agent, or Firm* — Lowe Hauptman & Ham, LLP

(57) ABSTRACT

The invention relates to time-delay and signal-integration linear image sensors (or TDI sensors). According to the invention, a pixel comprises a succession of several insulated gates covering a semiconducting layer, the gates of one pixel being separated from one another and separated from the gates of an adjacent pixel of another line by narrow uncovered gaps of a gate and comprising a doped region of a second type of conductivity covered by a doped superficial region of the first type; the superficial regions are kept at one and the same reference potential; the width of the narrow gaps between adjacent gates is such that the internal potential of the region of the second type is modified in the whole width of the narrow gap when a gate sustains the alternations of potential necessary for the transfer of charges from one pixel to the following one.

9 Claims, 4 Drawing Sheets

CHARGE-INTEGRATION MULTILINEAR IMAGE SENSOR

RELATED APPLICATIONS

The present application is based on, and claims priority from, French Application Number FR1150658, filed Jan. 28, 2011, the disclosure of which is hereby incorporated by reference herein in its entirety.

FIELD OF THE INVENTION

The invention relates to time-delay and signal-integration linear image sensors (or TDI sensors for "Time Delay Integration Linear Sensors"), in which an image of a line of points of an observed scene is reconstituted by the addition of successive images taken by several photosensitive lines observing successively one and the same line of the scene gradually as the scene travels before the sensor.

BACKGROUND OF THE INVENTION

These sensors are used for example in scanners. They comprise a bar of several parallel lines of photosensitive pixels; the sequencing of the control circuits of the various lines (the control of exposure time then of reading of the photogenerated charges) is synchronized relative to the relative travelling of the scene and of the sensor, so that all the lines of the sensor successively see one and the same line of the observed scene. The signals generated by each line are then added point by point for each point of the observed line.

At a constant exposure time, the sensitivity of the sensor is improved in the ratio of the number N of lines, or else, at constant sensitivity, the exposure time can be divided by N. This number N may be for example 16 or 32 for applications of industrial control or applications of earth observations from space, or even 60 to 100 lines for medical applications (dental, mammography, etc).

The signal-to-noise ratio is improved in the ratio of the square root of the number N of lines of the sensor.

Moreover, the non-uniformities of sensitivity of the pixels of one and the same bar, and the non-uniformities of dark current of the pixels, are diminished by the averaging that results from the addition of the signals of the various lines.

In charge-transfer image sensors (CCD sensors), the addition of the point-to-point signals is carried out simply by emptying from a line of pixels the charges generated and accumulated in the preceding line of pixels, in synchronism with the relative movement of the scene and of the sensor. The last line of pixels, having accumulated N times the charges generated by the observed image line, can be read.

The application of the CCD image sensors has the drawback of using high power supply voltages and consumes considerable power; this technology is based on the use of polycrystalline silicon gates that are adjacent and mutually overlapping; the density of integration is not very high.

The technology of the image sensors has subsequently evolved towards active-pixel sensors with transistors that are hereinafter called CMOS sensors for simplification because they are usually made using CMOS (complementary-metal-oxide-semiconductor) technology; in these CMOS sensors, there is no transfer of charges from line to line to a reading circuit or a register but there are active pixels with transistors that collect photogenerated electrical charges and convert them directly into a voltage or a current. The various lines of the sensor therefore successively supply voltages or currents representing the lighting received by the line. These structures do not make it possible to carry out noiseless accumulations of these currents or voltages; it is therefore difficult to produce a time delay integration sensor. The fabrication technology is nevertheless simple, it does not consume much power, and it operates at low voltage.

Attempts have however been made to produce CMOS time delay integration sensors.

Attempts have been made in particular to use switched capacitors in which successive received currents are integrated, thus accumulating on one and the same capacitor received charges of several pixels in a column (U.S. Pat. No. 6,906,749, WO0126382).

It has also been proposed to convert the signals originating from a line of pixels into digital values, to accumulate the digital value corresponding to the pixel of row j of the line in an accumulating register of row j which accumulates the digital values corresponding to the pixels of one and the same row j of N successive lines (patent FR2906080).

In patent FR2906081, it is proposed to apply to the photodiode of a pixel of a line the output voltage of a pixel of a preceding line in order to copy into it the charges of the preceding pixel before insulating the photodiode and integrating new charges due to the light, so that, at the end of an integration time, the photodiode comprises the sum of the charges corresponding to the preceding line and the new integrated charges. This operation however induces a transfer noise which deteriorates the signal-to-noise ratio.

Solutions using an accumulation of charges inside the pixel have been proposed, for example in patent publication US2008/0217661. They use a technology that is more complex than is strictly necessary to produce image sensors using CMOS technology, or else they have losses during the charge transfers.

Finally, in an earlier unpublished application by the applicant, it has been proposed to constitute pixels with an alternation of wide gates and narrow photodiodes separated from the gate by a region p++ at the potential of the substrate and forming a potential barrier preventing the charges from transferring except under very narrow gate fingers adjacent to the photodiode. The narrowness of the gate fingers creates, by the influence of the p++ regions that touch them, a potential barrier only when the gate is at low potential. When the gate is at high potential, this barrier lowers sufficiently. The directionality of the transfer is thus assured but at the price of a more complex structure and at the price of bottlenecks for the transfer of the charges.

The attempts to produce a time delay integration linear sensor using a technology that is simpler than the usual CCD technology have therefore not given complete satisfaction and one object of the invention is to propose another solution to these problems.

SUMMARY OF THE INVENTION

The object of the invention is therefore to propose a more advantageous solution for producing sensors operating according to the principle of charge-transfer structures but using a technology compatible with CMOS technology circuits, and notably a technology using only one gate level in polycrystalline silicon and not a double level of mutually overlapping gates as is the case in the conventional CCD technologies.

According to the invention, the proposal is for a charge-transfer image sensor operating in time-delay and charge integration, the sensor comprising N adjacent lines of P pixels for the purpose of an observation of one and same image line successively by several lines of pixels with accumulation of the electrical charges generated by an image point in the pixels of one and the same row of the various lines, the pixels being formed in a semiconducting layer of a first type of conductivity covered by insulated gates transparent to the light, and means being provided for applying to the gates an alternation of high and low potentials allowing the storage and then the directional transfer of charges from one gate to the next, characterized in that a pixel comprises a succession of several insulated gates above the semiconducting layer, the gates of one pixel being separated from one another and separated from the gates of an adjacent pixel of another line by narrow uncovered gaps located above a doped region of a second type of conductivity covered by a doped superficial region of the first type, the superficial regions being kept at one and the same reference potential, the width of the narrow gaps between adjacent gates being such that the internal potential of the doped region of the second type is modified in the whole width of the narrow gap when a gate adjacent to this gap receives the alternation of high and low potentials.

The result of this in particular is that, when two gates on either side of a narrow gap are both at one and the same potential higher or lower than the reference potential, the internal potential of the region of the second type in the narrow gap is influenced by the potential of the gates and tends to follow this potential upward or downwards respectively despite the presence of the superficial region brought to the reference potential.

The reference potential is preferably the common potential of the semiconducting layer of the first type. The superficial regions of the first type of conductivity are preferably all adjacent to deep diffusions of the same type that join the semiconducting layer. Thus, the superficial regions of the first type, situated in the narrow gaps between the gates, can all be set directly by this means to the reference potential of the semiconducting layer.

This new structure uses only one gate level because the narrow gaps between gates are not covered by a second gate level; it can therefore be produced using a technology that is very simple and compatible with the CMOS technologies. It allows a large degree of freedom of choice for the doping levels of the semiconducting regions situated between the gates. Since these dopings determine the levels of potential barriers and potential wells created in the semiconducting layer during the application of voltages to the gates, the invention makes it possible, by a choice of dopings, to optimize the directional transfer of charges without loss. We will return to this point later.

The pixel preferably consists of four adjacent gates separated by narrow gaps and is controlled by four phases, that is to say that all the gates of the same row in the various pixels receive one and the same phase taken from the four phases. The phases succeed one another so as to progressively push the charges in the desired direction of transfer.

The invention also applies to a pixel with three adjacent gates separated by narrow gaps, controlled by three successive phases.

BRIEF DESCRIPTION OF DRAWINGS

Other features and advantages of the invention will appear on reading the following detailed description that is made with reference to the appended drawings in which.

DESCRIPTION OF PREFERRED EMBODIMENTS

Figure 1:
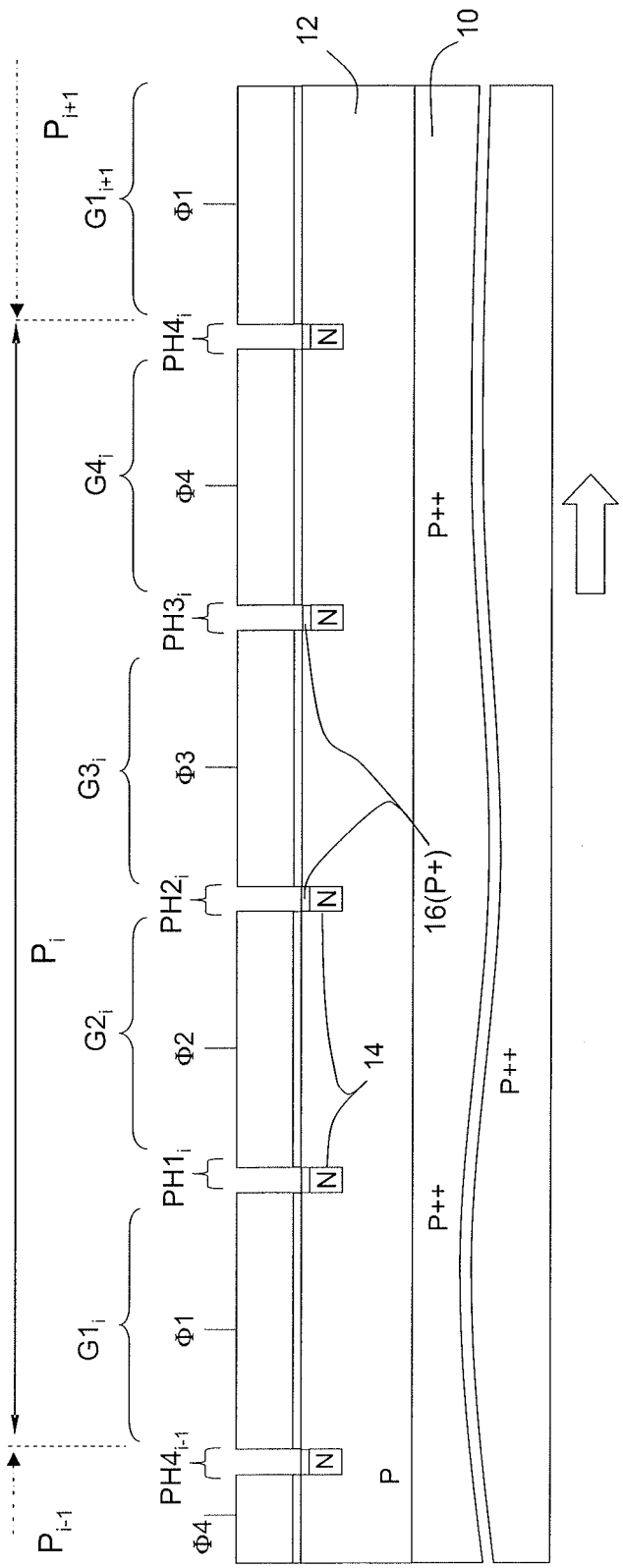
FIG. 1 represents a view in section, perpendicularly to the direction of the lines, of the structure of a multilinear photosensitive sensor according to the invention.

The view in section of FIG. 1 represents a pixel $P_i$ adjacent on one side to a pixel $P_{i-1}$ situated upstream, and adjacent on the other side to a pixel $P_{i+1}$ situated downstream in the same column of pixels. These pixels form part of an image-sensor bar comprising N adjacent lines of P pixels each, the bar being designed to operate in TDI mode. Each line of row i (i=1 to N) successively reads one and the same image line during a synchronized travelling of the image relative to the bar in the direction perpendicular to the direction of the lines; the charges collected by the pixels of one and the same row j (j=1 to P) in the various lines correspond to the observation of one and the same image point and are accumulated in order to obtain a larger signal (for a given exposure time of each pixel line) than if a single line saw the image; the signal-to-noise ratio is improved by this multiple reading of one and the same image point.

The columns adjacent to the column shown, not visible because of the fact that the view is in section in the column direction, are separated from one another by regions of insulation which prevent the electrical charges from travelling from a pixel of one column to a pixel of another column. These regions of insulation may be highly doped semiconducting regions brought to a reference potential creating a natural potential barrier between these pixels.

The pixels are formed in a semiconducting substrate 10 of which the upper part is a lightly doped epitaxial semiconducting layer 12. In this example, the substrate is of highly doped p++ type and the epitaxial layer is of the p type (the first type of conductivity). If the epitaxial layer were of type n, it would be necessary to invert all the types of conductivity that will now be defined, and the signs of the potentials applied to the photodiodes and the gates. The substrate 10 is in principle of the same type of conductivity as the epitaxial layer 12, but it could equally be of opposite type.

A pixel $P_i$ comprises, in the column direction, a series of several gates, in this example four adjacent gates $G1_i$ to $G4_i$, insulated from the epitaxial layer and separated from one another by narrow gaps that are not covered by a gate. The gaps preferably all have the same width. The last gate $G4_i$ of the pixel of row i is separated from the first gate $G1_{i+1}$ of the following pixel $P_{i+1}$ by a narrow gap which is preferably identical to the others.

The narrow gaps have a width that is at the limit or almost at the limit of what is allowed by the technology for defining the gates in industrial production, when the gates are made from a single level of deposited layer. The layer deposited to form the gates is preferably made of polycrystalline silicon. This layer rests on a thin insulation layer, preferably made of silicon oxide. A typical order of magnitude of the width of the narrow space is 0.25 micrometers for a so-called 0.18 micrometer technology which would allow the limit to define lines 0.18 micrometer wide.

In the narrow gaps, regions 14 of type n (the second type of conductivity, the first type being that of the epitaxial layer 12) are formed. On top of each of the regions 14 of type n thus formed between two adjacent gates, a respective superficial region 16 of the first type of conductivity (p+, more doped than the epitaxial layer) is formed, less deep than the regions 14.

The insulated gates of the pixels are therefore separated from one another by narrow regions 14 of type n covered by a superficial diffused region 16 of type p. The regions of type n 14 are floating, that is to say that they are not connected to an electrical conductor that would apply an imposed potential to them. The regions 16 of type p are all brought to one and the same reference potential, and this potential is preferably that of the substrate 10 which is usually also that of the epitaxial layer 12 when the latter is of the same type as the substrate. It will be considered that this potential is a zero reference potential. In order to bring the regions p to the zero potential, provision is made in practice for these regions 16 to be adjacent to highly doped diffusions of type p which join the epitaxial layer and which are aligned on its zero potential. These diffusions, not visible in FIG. 1, may be the diffusions which are used in order to insulate the columns of pixels from one another.

The depth profile of the potential in a region 14 depends first of all on the doping and on the depth of the region 14, and on the doping of the epitaxial layer. If, moreover, charges are stored in these regions, the potential depends on the quantity of charges stored.

If the regions 14 were wide, that is to say if their central portion did not sustain the influence of the potentials applied to the adjacent gates, the potential profile in the regions 14 as a function of the depth would naturally present a minimum to a certain depth (in the vicinity of the junction between the region n and the epitaxial layer p). This minimum has a value that will be called the built-in potential $V_{bi}$; this value $V_{bi}$ depends on the values of doping and on the depth of the doped zones. Typically, as an example, the built-in potential of a photodiode consisting of a region n covered with a superficial region p kept at the zero reference potential may be approximately 1.5 volts with dopings conventionally used for photodiodes. The regions n 14 covered by a superficial diffusion p 16 are built as photodiodes and that is why it is possible to make reference here to a built-in potential as for photodiodes.

However, in the sensor according to the invention, the gaps between the gates are so narrow that the potential in the region n is greatly influenced by the presence of the adjacent gates; this differs therefore from the operation of a conventional photodiode in which the potential in the region n assumed to have no charges would remain fixed because the superficial region is kept at the reference potential; in the sensor according to the invention, the influence of the adjacent gates extends beneath the full width of the gaps because of their narrowness.

The lighting of the pixels by photons is carried out through the gates. The latter are transparent to the light in the range of the visible wavelengths (slightly less transparent in the blue but very transparent in the red). The pixel is therefore of the photomos type. To a lesser degree (because the spaces between the gates are much narrower than the gates) there is also a direct lighting of the regions n 14 even though this lighting does not contribute very much to the total production of charges. The regions n 14 therefore behave slightly like pinned photodiodes ("pinned" indicating that the surface potential of these regions is fixed). $PH1_i$, $PH2_i$, $PH3_i$, $PH4_i$ are the narrow gaps between adjacent gates of the pixel of row i; in FIG. 1, it will be understood that $PH4_{i-1}$ is the gap between the last gate of the pixel $P_{i-1}$ and the first gate of pixel $P_i$.

This lighting of the epitaxial layer 12 under the gates and between the gates generates electrical charges and these charges accumulate in the potential wells formed under the gates during the integration periods. In what follows, it is considered that the electrical charges that are collected in this way are electrons. In order to create potential wells under the gates, a positive potential relative to the potential of the epitaxial layer will be applied to these gates; in order to create potential barriers under a gate, a zero potential relative to the reference potential of the epitaxial layer will be applied to the gate.

In order to provide a better understanding of how the sensor according to the invention operates, what the diagrams of potentials would be in the semiconducting layer 12 during the various integration and transfer phases if the width of the regions 14 were larger, that is to say such that the gate potential does not influence the potential of the regions 14 over the whole width of the latter, will first be shown.

Figure 2:
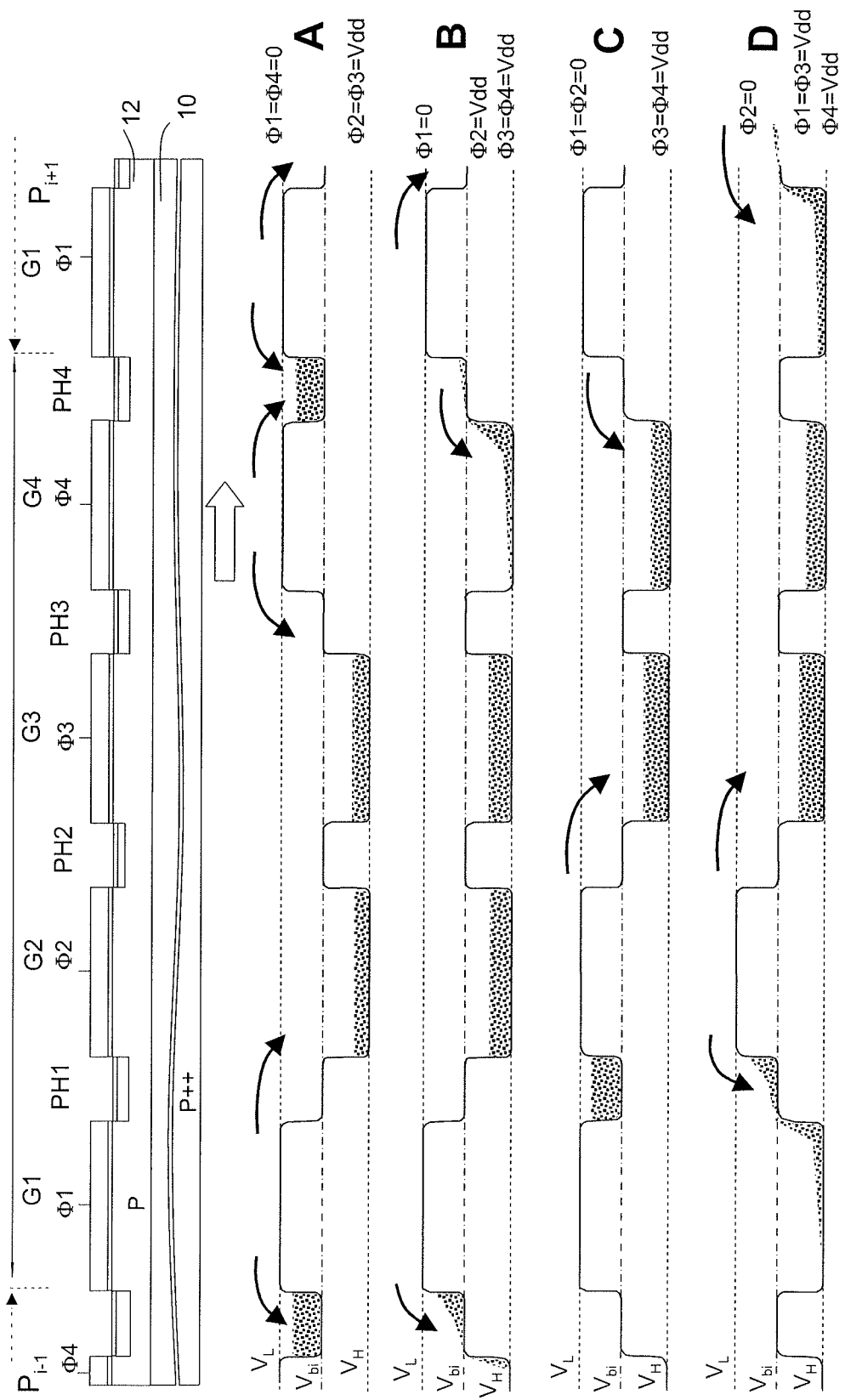
FIG. 2 represents the diagram of the potentials created in the semiconductor with the potential wells and the potential barriers in the various phases of integration and of transfer, as they would be if the gates were separated by wide gaps.

FIG. 2 shows this situation and it is assumed that the pixel is a pixel with four gates operating with four control phases $\Phi 1$, $\Phi 2$, $\Phi 3$, $\Phi 4$ applied respectively to the gates G1, G2, G3, G4 of all the lines. The phases bring the gates alternately to potentials 0 and Vdd, which establish under the gates potentials that are alternately $V_L$ and $V_H$ (in the absence of charges accumulated under the gates). According to the usual manner of representation when the accumulated charges are electrons, the potentials increase towards the bottom of the diagram.

It is assumed that the dopings n and p have been chosen such that the built-in potential $V_{bi}$ of the regions 14 is situated approximately in the middle of the gap between $V_L$ and $V_H$.

During a first step (line A of the diagram; $\Phi 1$, $\Phi 4$ at 0, $\Phi 2$, $\Phi 3$ at Vdd), the gates G1 and G4 are brought to a low potential and the gates G2 and G3 to a high potential. A potential well is created under the gates G2 and G3. Potential barriers are created under gates G1 and G4. Moreover, a potential barrier subsists in the region PH2 separating G2 and G3, and a (superfluous) potential well is created in the region situated between a gate G1 and a gate G4 that precedes it. The charges photogenerated under the gates G2 and G3 and under the regions PH1, PH2 and PH3 are accumulated in the wells under the gates G2 and G3. The charges generated under the gates G1 and G4 are shared upstream (to the left) and downstream (to the right) and are added to the charges generated directly under the gates G2 and G3 of the pixel in question or of the upstream and downstream pixels. But it is clear that charges have been trapped in the potential well that exists under the region PH4 situated upstream of the gate G1, and in the potential well that exists under the region PH4 downstream of the gate G4. These wells are actually created because the superficial regions 16 at zero potential impose a potential equal to $V_{bi}$, higher than $V_L$ in the regions PH4.

In the second step (line B of the diagram; $\Phi 1$ at 0, $\Phi 2$, $\Phi 3$ at Vdd, only the fourth phase $\Phi 4$ changes state and goes to Vdd). Consequently, only the gate G4 changes to go to the high level. Potential wells now exist under G2, G3, G4 and potential barriers subsist in the regions PH2 and PH3. The charges photogenerated under the gates G2 and G3 and under the regions PH1 to PH4 accumulate under the gates G2, G3 and G4. The charges that were trapped under the region PH4 of the pixel P spill over to the gate G4 situated upstream.

In the third step (line C of the diagram; $\Phi 1$ at 0, only the second phase $\Phi 2$ goes to 0, $\Phi 3$, $\Phi 4$ are at Vdd); the gate G2 changes to go back to the low level. It pushes away the charges that it was storing to the potential well under the gate G3 which is at the low level. But a portion of these charges is trapped in the potential well of depth $V_{bi}$ which is then created in the region PH1 between the gates G1 and G2.

In the fourth step (line D of the diagram; Φ1 goes to Vdd, Φ2 is at 0, Φ3, Φ4 are at Vdd), only the gate G1 changes by going to the high level. In this transition, the charges trapped in the region PH1 spill over in the upstream direction while what is desired is a directional transfer in the downstream direction of all the charges previously stored under the gates G2 and G3.

A fraction of the stored charges is therefore trapped in steps A and C and is sent back upstream in steps B and D.

In a fifth step not shown, it is the gate G3 which goes back to the low level. The accumulated charges have advanced by a half-pixel relative to the configuration of line A since they are now situated under the gate G4 and under the gate G1 of the next pixel downstream. The steps not shown, five to eight, are deduced from the steps one to four by now causing G3 and G4 (that is to say Φ3 and Φ4) to play the roles previously played by G1 and G2 (Φ1 and Φ2) and by causing, as a consequence, G1 and G2 to play the roles previously played by G3 and G4:

phase Φ3 is reduced to zero,
then phase Φ2 is raised to Vdd,
then phase Φ4 is reduced to 0,
and finally phase Φ1 is reduced to 0 according to the configuration of line A.

A complete cycle has then been made and the charges have advanced by a complete pixel and are under the gates G2 and G3 of the next pixel.

For an operation of TDI type, the advance takes place in synchronism with the travelling of the image in front of the sensor so that the charges stored under the gates of the downstream pixel $P_{i+1}$ are the total of the charges accumulated by the lighting of this pixel and of the charges accumulated by the pixels of the previous row at the moment when they saw the same image point.

It can be seen therefore that, during each cycle of advancement of the charges, charges are sent backwards because of the potential well of depth $V_{bi}$ that subsists under the regions PH that separate two gates simultaneously at low potential.

Figure 3:
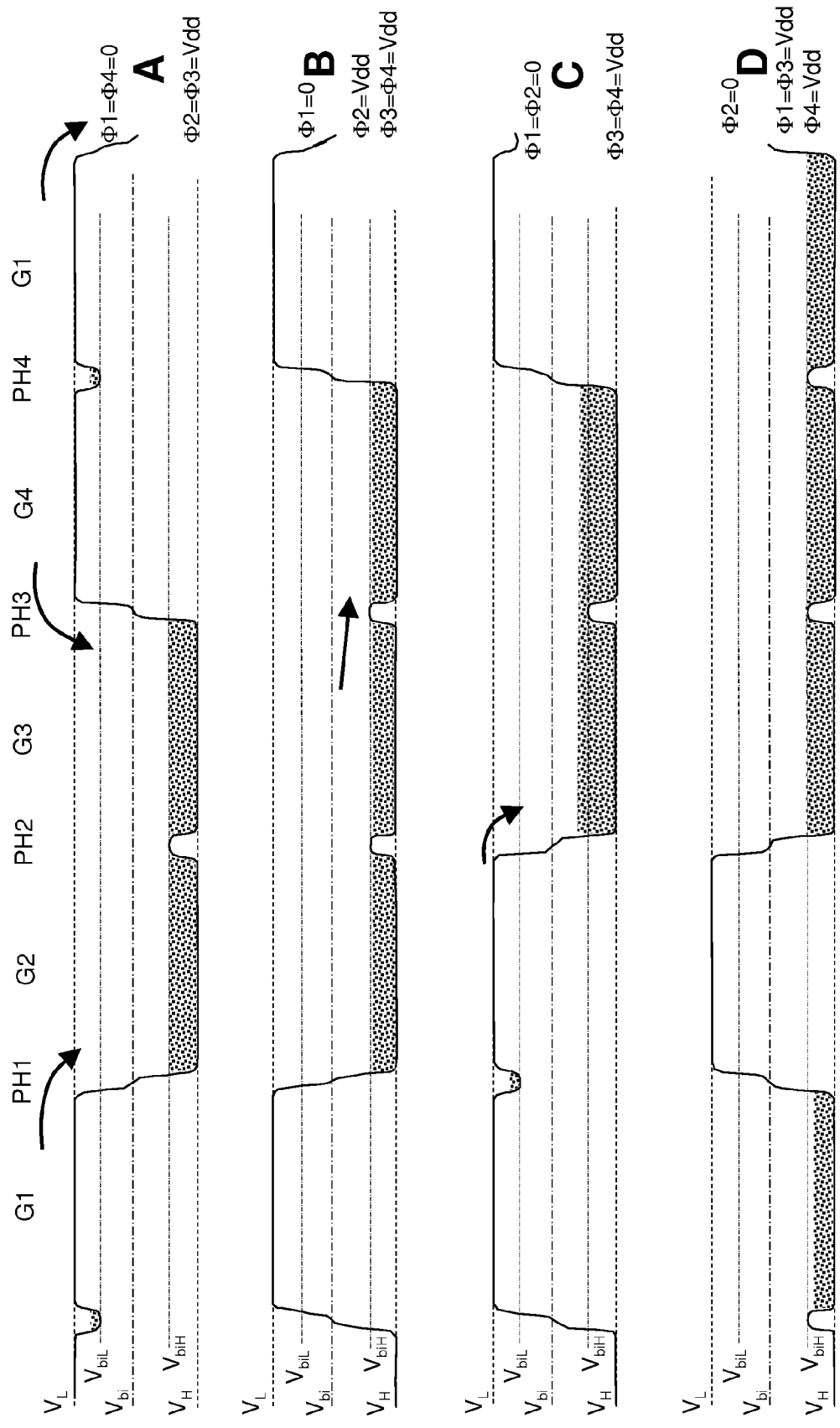
FIG. 3 represents the diagram of the potentials created in the semiconductor in the case of the sensor according to the invention during four stages of transfer representing a transfer of charges on a half-pixel in the direction of the columns.

FIG. 3 now represents what happens in the case of the sensor according to the invention. Only the first four steps as in FIG. 2 will be described, corresponding to the advancement by a half-pixel, these steps being followed by four other identical steps so that the charges advance by a complete pixel. It will be seen that a potential well still subsists under the regions PH which separate two gates brought simultaneously to a low potential. But, on the one hand, it is very narrow and very shallow, and on the other hand, it will be shown that unexpectedly this potential well is not a problem because in practice is remains empty of charges and consequently it does not send charges upstream at the time of the second or the fourth step.

If $V_{bi}$ is the built-in potential of the photodiode regions PH1 to PH4, resulting directly from the level of doping used, the real potential that exists in these regions differs greatly from the level $V_{bi}$ in the whole width of these regions, because of the strong influence of the gate potentials at 0 volt or Vdd. FIG. 3 will therefore not show the levels of fixed potential of the regions PH of FIG. 2.

Thus, if two gates adjacent to one and the same region are at 0 volt, the potential of the region 14 becomes $V_{biL}$, significantly lower than $V_{bi}$. If the two gates are at Vdd, the potential of the region 14 becomes $V_{biH}$, significantly higher than $V_{bi}$. If one of the gates is at Vdd, and the other is at 0, the potential in the region 14 varies continuously, with no plateau, from the potential $V_H$ that is present under the first gate to the potential $V_L$ that is present under the other.

The influence of the potential of the gates over the regions 14 is felt over the whole width of the regions 14 separating the gates because of the narrowness of these regions. This now gives a configuration in which there are in a way two built-in potentials that are very different, $V_{biL}$ and $V_{biH}$, in the regions 14, depending on whether the two gates adjacent to the region 14 are both at the low potential or both at the high potential.

Consequently, a shallow potential well is created between the two gates at low potential; and similarly a low potential barrier is created between two gates at high potential.

The phases applied to the gates are exactly the same as in FIG. 2 and the four steps that succeed one another for a transfer of a half-pixel from upstream to downstream are in the order:

line A of the diagram; Φ1, Φ4 at 0, Φ2, Φ3 at Vdd,
line B of the diagram; Φ4 goes to Vdd,
line C of the diagram; Φ2 goes to 0,
line D of the diagram: Φ1 is goes to Vdd.

Then G1 and G2 are made to play the roles previously played by G3 and G4 and vice versa in order to complete the transfer over another half-pixel in the following four phases.

The charges trapped in the regions 14 in steps A and C are of small quantity because of the narrowness and the shallowness of the potential wells of depth $V_{biL}$.

But moreover, if we observe precisely what happens during the transition from step B to step C (and from step D to subsequent step A), it can be seen that there is in practice no charge trapped in these shallow potential wells and consequently no charge sent back upstream in the following steps.

Specifically, because of the strong influence of the gates on the potential in the regions 14, the following thing happens, for example in the case of the transition from step B to step C: while the potential G2 descends in order to chase to gate G3 the charges that are present under the gate G2, the potential of the region PH1, drawn downwards because of the presence of the gate G1 which is already at low potential, descends at the same time through influence of the gate. The result of this is that the charges that are repulsed by the gate G2 towards the gate G3 in step C have the time to spill over totally to the gate G3 before a potential well properly forms in the region PH1. When this well truly forms, at the end of the descent of the potential of gate G2, it no longer collects any fraction of the charge previously accumulated under gate G2 because these charges have had the time to spill over under gate G3.

Figure 4:
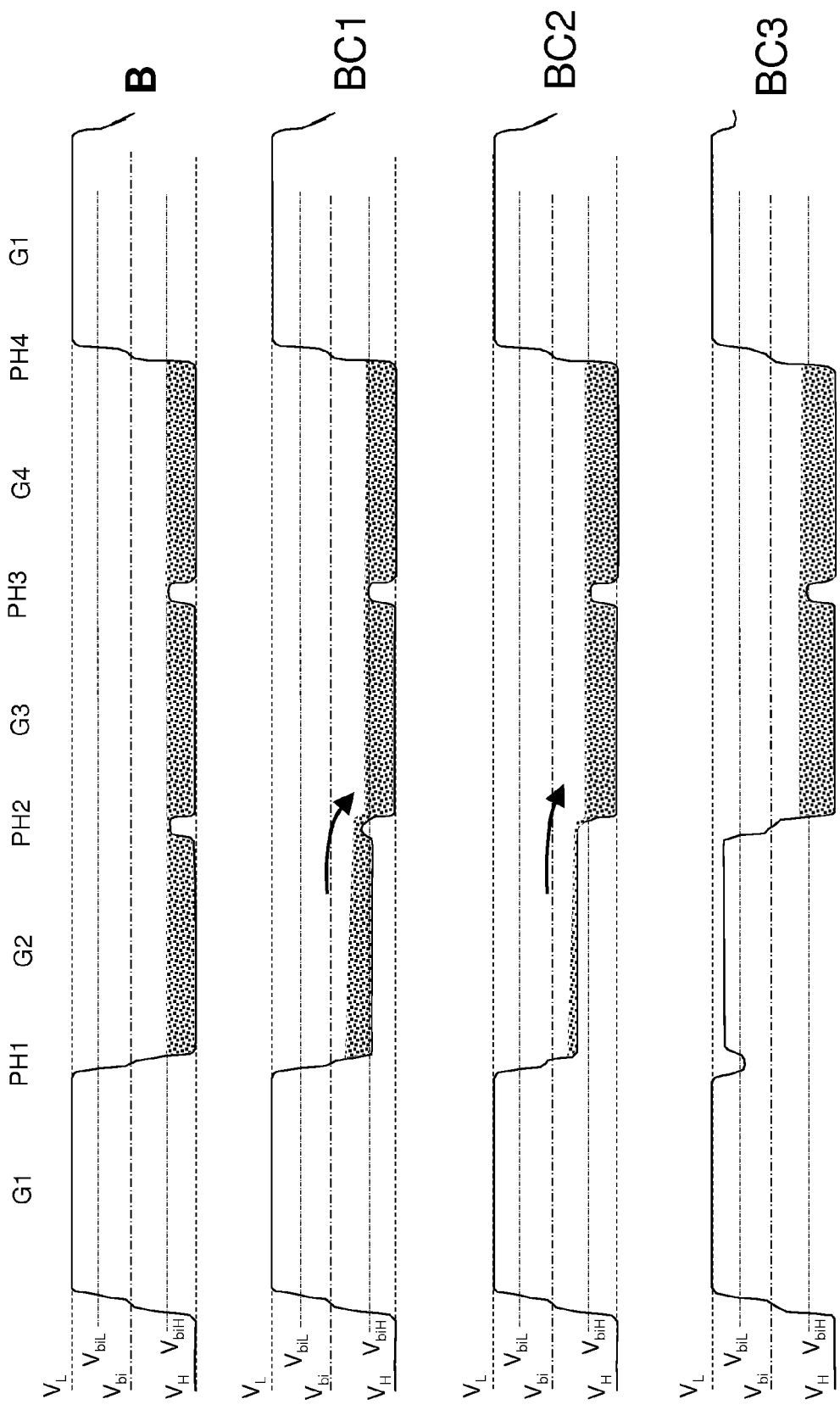
FIG. 4 represents the detail of the transition from the second to the third step.

In order to make it easier to understand this procedure of the transition between steps B and C, FIG. 4 shows, in four successive images, a breakdown of the distribution of the potentials during the transition between steps B and C, that is to say during the descent of the potential of gate G2 from Vdd to 0.

Line B is the starting step, identical to line B of FIG. 3.

On line BC1, the potential under gate G2 begins to descend, and the charges stored under the gate begin to spill over under gate G3 over the low potential barrier of the region PH2.

On line BC2, the potential continues to descend; the charges finish spilling under G3.

On line BC3, the potential has almost reached its low level $V_L$ and a potential well begins to form under the region PH1, but there are no longer any charges under the gate G2 and consequently no charge is trapped in the region PH1.

Consequently, when, at a given moment, the potential under gate G2 is below the potential created under the region PH2 situated downstream of the gate G2, while the potential under gate G2 remains higher than the potential under the region PH1 situated upstream, the charges can totally spill over to gate G3. This was not possible in the structure shown in FIG. 2 (wide gaps between gates) because the potential under gate G2 could not be both below the potential in the region PH2 and higher than the potential in the region PH1 since these potentials were identical.

Simulations of the potentials under gate G2 and in the regions PH1 (upstream) and PH2 (downstream) during the transition from step B to step C show that it is indeed what happens when observation is made of the transitional phase of descent of the potential of gate G2, as soon as the gates G2 sufficiently influence the potential in the gaps between gates in order to separate one from the other, throughout the whole gap between gates, the potential $V_{biL}$ and the potential $V_{biH}$. A doping of region N 14 will be chosen that is neither too low (there could remain a potential barrier on the downstream side), nor too high (a potential well would be created too quickly upstream).

The device that has been described comprises four gates for each pixel; the gates are each controlled by one respective phase out of four phases; the charges are stored under two adjacent gates and eight steps are necessary to transfer the charges from one pixel to the next pixel.

The invention can also be used for a pixel with three adjacent gates controlled by three phases; the charges are stored under one gate, and six steps are necessary to transfer the charges from one pixel to the next pixel. The successive steps are:

Φ2 at Vdd, Φ1 and Φ3 at 0, storage of the charges under the second gate;

Φ3 goes to Vdd, the charges are spread under G2 and G3;

Φ2 goes to zero, the charges are concentrated under G3; they have advanced from gate G2 to gate G3;

Φ1 goes to Vdd, the charges are spread between G3 and the gate G1 of the next pixel;

Φ3 goes to zero; the charges are concentrated under gate G1 of the next pixel.

And so on, through circular permutation of the phases, the charges advance from one gate in two steps and from a complete pixel in six steps.

Finally, after transfer of the charges along a column of pixels, the charges are spilt over from the last pixel to a charge-reading circuit. The reading circuit preferably comprises a floating diffusion of type N, similar to the regions N 14 but not covered by a superficial region P+, a reading transistor, a reset transistor made of a drain N+ brought to a positive reference potential and an insulated transfer gate separating the floating diffusion from the drain. The floating diffusion is electrically connected to the gate of the reading transistor.

After the last charge-integration step in the line of row N, the charges contained in the second photodiode of the pixel $P_N$ are spilt into the floating diffusion of the reading circuit, through a final gate which may be controlled by the potential Φ1 as if there were an N+1$^{th}$ pixel after the pixel $P_N$. This spilling is carried out after a reset command on the transfer gate making the reset transistor conducting. The reading transistor is mounted as a voltage tracker in order to transfer to its source the potential of its gate which represents the quantity of charges spilt into the floating diffusion after the reset.

The invention claimed is:

1. The charge-transfer image sensor operating in time-delay and charge integration, the sensor comprising:

N adjacent lines of P pixels for an observation of one image line successively by several lines of pixels with accumulation of the electrical charges generated by an image point in the pixels of a given rank in the various lines, the pixels being formed in a semiconducting layer of a first type of conductivity covered by insulated gates transparent to light, and means for applying to the gates an alternation of high and low potentials allowing a storage and then a directional transfer of charges from one gate to a next gate, wherein a pixel in a given line comprises a succession of several insulated gates above the semiconducting layer, the gates of said pixel being separated from one another and separated from a gate of an adjacent pixel of another line by narrow gaps not covered by a gate and located above a doped region of a second type of conductivity covered by a doped superficial region of the first type, the superficial regions being kept at a common reference potential, a width of the narrow gaps between adjacent gates being such that an internal potential of the doped region of the second type is modified in a whole width of the narrow gap when a gate adjacent to said narrow gap receives said alternation of high and low potentials.

2. The image sensor according to claim 1, wherein the reference potential is a common potential of the semiconducting layer of the first type.

3. The image sensor according to claim 2, wherein the superficial regions of the first type of conductivity are all adjacent to deep diffusions of the same type that join the semiconducting layer.

4. The image sensor according to claim 1, wherein the pixel comprises four adjacent gates separated by narrow gaps and controllable by four phases, and all the gates of the same row in the various pixels receive one and the same phase taken from the four phases.

5. The image sensor according to claim 1, wherein the pixel comprises three adjacent gates separated by narrow gaps and controllable by three phases, and all the gates of one and the same row in the various pixels receive one and the same phase taken from the three phases.

6. The image sensor according to claim 2, wherein the pixel comprises four adjacent gates separated by narrow gaps and controllable by four phases, and all the gates of the same row in the various pixels receive one and the same phase taken from the four phases.

7. The image sensor according to claim 2, wherein the pixel comprises three adjacent gates separated by narrow gaps and controllable by three phases, and all the gates of one and the same row in the various pixels receive one and the same phase taken from the three phases.

8. The image sensor according to claim 3, wherein the pixel comprises four adjacent gates separated by narrow gaps and controllable by four phases, and all the gates of the same row in the various pixels receive one and the same phase taken from the four phases.

9. The image sensor according to claim 3, wherein the pixel comprises three adjacent gates separated by narrow gaps and controllable by three phases, and all the gates of one and the same row in the various pixels receive one and the same phase taken from the three phases.

\* \* \* \* \*